United States Patent [19]

Kuwata et al.

[11] Patent Number: 4,888,246
[45] Date of Patent: Dec. 19, 1989

[54] DIELECTRIC THIN FILM, AND METHOD FOR MAKING THE THIN FILM

[75] Inventors: Jun Kuwata, Osaka; Yosuke Fujita, Ashiya; Takao Tohda; Atsushi Abe, both of Ikoma; Tomizo Matsuoka, Osaka, all of Japan

[73] Assignee: Matsushita Electric Industrial Co., Ltd., Japan

[21] Appl. No.: 866,206

[22] Filed: May 23, 1986

[30] Foreign Application Priority Data

May 23, 1986 [JP] Japan ............... 60-110813
May 23, 1986 [JP] Japan ............... 60-110814

[51] Int. Cl.$^4$ ............. B32B 15/00; C23C 14/34
[52] U.S. Cl. ............. 428/432; 204/192.15; 204/192.22; 428/433; 428/698
[58] Field of Search ............. 204/192.15, 192.18, 204/192.22, 192.26, 192.27, 192.28, 192.29; 428/432, 433, 698, 704

[56] References Cited

U.S. PATENT DOCUMENTS 3,627,662 12/1971 Feuersanger et al. ..... 204/192.22 X
3,819,990 6/1974 Hayashi et al. ............ 204/192.22 X

FOREIGN PATENT DOCUMENTS 2026040A 1/1980 United Kingdom ........... 204/192.22

OTHER PUBLICATIONS

Iida et al., "BaTiO$_3$ . . . or GaAs", Applied Physics Letters, vol. 18, No. 9, May/1971, pp. 391-392.
Pratt et al., "Fabrication . . . Films", The Jr. of Vac. Sci. and Techn., vol. 8, No. 1, Jan.-Feb./1971, pp. 256-260.
Shintani et al., "Preparation . . . Sputtering", Jr. of Applied Physics, vol. 41, No. 6, 5/70, pp. 2376-2380.

Primary Examiner—Nam X. Nguyen
Attorney, Agent, or Firm—Lowe, Price, LeBlanc, Becker & Shur

[57] ABSTRACT

A dielectric thin film element comprising a dielectric substrate and a dielectric thin film formed on the substrate. The thin film is made of a perovskite type oxide and formed by sputtering in an atmosphere containing nitrogen, by which the dielectric constant and the breakdown electric field strength are greatly improved. Thin film devices using the film and a method for making the thin film are also described.

11 Claims, 2 Drawing Sheets

DIELECTRIC THIN FILM, AND METHOD FOR MAKING THE THIN FILM

BACKGROUND OF THE INVENTION

1. Field of the Invention

This invention relates to dielectric thin film elements, particularly dielectric oxide thin film elements, and also to thin film devices using the dielectric thin film elements. The invention also relates to a method for making such dielectric thin films as mentioned above. The thin fim devices of the invention may be, for example, a thin film electroluminescent device and a thin film transistor. The thin film electroluminescent device is suitably used in a flat display such as, for example, a character or graphic terminal display such as of personal computers and can thus be widely utilized in the field of office machines. The thin film transistor may be used to drive a light-receiving element such as in a pyroelectric IR detector or a light-receiving element such as in an electroluminescent display device.

2. Description of the Prior Art

The electric performance of dielectric thin films is determined by several factors or parameters such as a dielectric constant, a dielectric loss, a breakdown electric field strength, a breakdown mode and the like. These factors are all important, but when an electric capacitance and a dielectric strength are the first importance as in capacitors, the figure of merit, $q_m$, is represented by the following equation $$q_m = \epsilon_r \epsilon_0 E_b$$

in which $E_0$ is a dielectric constant of vacuum of $8.854 \times 10^{-12}$ F/m, $\epsilon_r$ and $E_b$ are, respectively, a specific inductive capacity and a breakdown electric field strength. The figure of merit, $q_m$, is a maximum charge density (c/m$^2$) at the time of dielectric breakdown. The figures of merit of various known dielectric thin films are shown in Table 1 below.

TABLE 1

| Material | Figure of Merit, $q_m$, (C/m$^2$) | $E_b$ (MV/cm) | $\epsilon_r$ |
|---|---|---|---|
| Y$_2$O$_3$ | 0.03~0.05 | 3~5 | 12 |
| Al$_2$O$_3$ | 0.04 | 5 | 8 |
| SiO$_2$ | 0.02 | 6 | 4 |
| Si$_3$N$_4$ | 0.04~0.06 | 6~8 | 8 |
| Ta$_2$O$_5$ | 0.03 | 1.5 | 23 |
| Ta—O—N | 0.06 | 3.3 | 22 |
| PbTiO$_3$ | 0.07 | 0.5 | 150 |
| SrTiO$_3$ | 0.19~0.25 | 1.5~2 | 140 |
| BaTa$_2$O$_6$ | 0.07 | 3.5 | 22 |
| PbNb$_2$O$_6$ | 0.06 | 1.5 | 41 |

As will be seen from the above table, perovskite type oxides, such as SrTiO$_3$ and PbTiO$_3$, have larger figures of merit than the other materials when applied as a dielectric thin film. This is ascribed to the large specific inductive capacity of these perovskite type oxides, but the breakdown electric field strength is relatively low.

On the other hand, it is known that tantalum metal used as a target is subjected to a reactive sputtering technique using a mixed gas of oxygen and nitrogen to obtain a dielectric oxide, such as Ta—O—N, whose breakdown electric field strength is two or more times the strength of tantalum oxide [S. J. Ingrey, W. D. Westwood, B. K. Maclaurin; Thin Solid Films 30 (1975) 377-381].

Upon determination of a Si—Al—O—N composite film obtained from a composite target of Si$_3$N$_4$ and Al$_2$O$_3$ by sputtering, the figure of merit has been found to be 0.064 C/m$^2$, which is smaller than the values of the perovskite type oxide dielectric films. For the fabrication of thin film capacitors, if the breakdown electric field strength of the perovskite type oxide dielectric films can be increased to such an extent as other dielectric films, the figure of merit can be further improved, making it possible to make a capacitor of a large capacitance and a high breakdown voltage.

Moreover, if the perovskite type oxide dielectric film, which has a high breakdown electric filed strength, is provided, the film is useful in making thin film devices including, for example, thin film electroluminescent devices and thin film transistors. As is known in the art, an elctroluminescent device (hereinafter referred to simply as EL device) which emits light by application of an AC electric field includes a phosphor layer, a dielectric layer formed on one or both surfaces of the phosphor layer, and two electrodes formed on opposite sides of the phosphor layer. The phosphor layer is generally made of a matrix of ZnS, ZnSe or SnF$_2$ to which Mn or fluorides of a rare earth metal serving as light-emitting centers are added. The dielectric materials used include Y$_2$O$_3$, SiO$_2$, Si$_3$N$_4$, Al$_2$O$_3$ and Ta$_2$O$_5$. In recent years, attempts have been made to employ perovskite type oxides such as, for example, PbTiO$_3$, SrTiO$_3$ and BaTiO$_3$. In the electroluminescent device, the phosphor layer has generally a thickness of from 500 to 700 nm and the dielectric layer has a thickness of from 400 to 800 nm. With a ZnS phosphor device in which Mn is added as light-emitting centers, a maximum luminance reaches 3500 to 5000 Cd/m$^2$ by voltage application at a frequency of 5 KHz.

When the device is energized by AC current, the voltage applied to the device is divided into the phosphor layer and the dielectric layer. The EL device is equivalent to two capacitors connected in series, so that $$\epsilon_i V_i / t_i = \epsilon_Z V_Z / t_Z$$

in which and $\epsilon_i$, $V_i$, $t_i$ are, respectively, a specific indictive capacity, an applied voltage and a thickness with respect to the dielectric layer, and $\epsilon_Z$, $V_Z$, $t_Z$ are, respectively, a specific inductive capacity, an applied voltage and a thickness with respect to the ZnS. If the thicknesses of the respective layers are assumed to be equal, $\epsilon_Z$ is about 8 to 9 for ZnS, so that with Y$_2$O$_3$, SiO$_2$ Si$_3$N$_4$ and Ta$_2$O$_5$ whose $\epsilon_i$ is in the range of about 4 to 25, only a half of the external voltage is applied to the ZnS layer. On the other hand, the perovskite type oxides, such as, for example, PbTiO$_3$, BaTiO$_3$ and SrTiO$_3$, have an $\epsilon_i$ value of about 50 to 150, and thus about 80% of the external voltage is applied to the ZnS layer. In this sense, the perovskite type oxides are useful as a dielectric layer for the EL device. However, the perovskite type oxide layer is disadvantageous as described before, i.e. the breakdown electric field strength is below half the strength of thin films of low dielectric constants such as of Y$_2$O$_3$. For instance, with PbTiO$_3$, the strength is about 0.5 MV/cm and with SrTiO$_3$, the strength is about 1.5 to 2 MV/cm. On the other hand, with Y$_2$O$_3$, the strength is about 3 to 5 MV/cm and with Si$_3$N$_4$, the strength is from 6 to 8 MV/cm.

The above disccusion is true of a thin film transistor which is used to drive a light-receiving device, such as a pyroelectric detector, or a light-emitting device, such as an EL display.

SUMMARY OF THE INVENTION

It is therefore an object of the present invention to provide a dielectric thin film element which has a very high figure of merit and is obtained by a very simple method.

It is another object of the invention to provide a dielectric thin film element which is very useful in making a capacitor of a large capacitance and semiconductor devices.

It is a further object of the invention to provide a dielectric thin film element which makes use of perovskite type oxides.

It is a still further object of the invention to provide an electroluminescent device which has a high luminance and is capable of withstanding a high breakdown voltage whereby an electroluminescent display of high image quality and reliability can be fabricated in high yield.

It is another object of the invention to provide a thin film transistor using a dielectric thin film of the type mentioned above as a gate oxide layer whereby the transistor has a small leak current and a large specific inductive capacity.

It is another object of the invention to provide a method for making such a dielectric thin film as discussed above.

According to the invention, there is provided a dielectric thin film element which comprises a dielectric substrate and a dielectric thin film formed on the substrate, the film consisting essentially of a perovskite type oxide and formed by a sputtering technique in which the perovskite type oxide is provided as a target and sputtered in an atmosphere comprising nitrogen. Other objects, advantages and features of the invention will become apparent from the following description.

DETAILED DESCRIPTION AND EMBODIMENTS OF THE INVENTION

The dielectric thin film element of the invention is characterized by forming, on a dielectric substrate, a dielectric thin film by a sputtering method in which a perovskite type oxide ceramic is sputtered in a sputtering atmosphere comprising nitrogen gas. It is important to effect the sputtering of the oxide ceramic in an atmosphere containing nitrogen gas. The resultant dielectric thin film has an electrically improved stability and an increasing breakdown electric field strength without an appreciable lowering of a dielectric constant.

Figure 1:
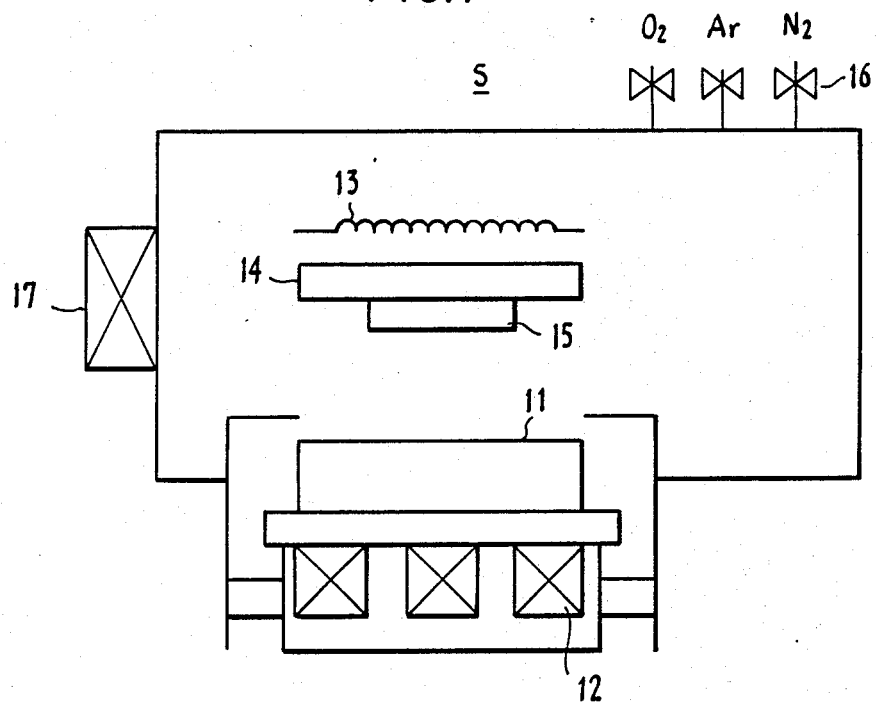
FIG. 1 is a schematic view of a sputtering apparatus for making a dielectric thin film according to one embodiment of the invention.

Reference is now made to the accompanying drawings and particularly, to FIG. 1, which illustrates an apparatus for making a dielectric thin film according to the invention. In FIG. 1, there is shown a sputtering apparatus S which has a target 11 and a magnet 12 located below the target 11, thus the apparatus being a high frequency magnetron sputtering apparatus using a high frequency power source (not shown). The target 11 used is a perovskite type oxide ceramic. Above the target 11 is provided a heater 13 which is used to heat a substrate 15 attached to a substrate holder 14. Three gas introduction ports 16 for nitrogen, oxygen and an inert gas, such as Ar, are provided at the top of the apparatus S. Reference numeral 17 designates an exhaust system.

In operation, when the high frequency magnetron sputtering is effected, the substrate is heated to a temperature of 300° to 600° C. while controlling a pressure of gases in the apparatus at from 0.4 to 4 Pa., thereby forming a dielectric thin film on the substrate 15.

The perovskite type oxide ceramics useful in the present invention may be almost all types of perovskite oxides and are preferably represented by the formula, $AMO_3$, in which A represents at least one element selected from the group consisting of Ca, Sr, Ba and Pb, and M represents at least one element selected from the group consisting of Ti, Zr, Hf and Sn.

The substrate should be dielectric in nature and includes, for example, glasses, quartz, MgO crystal, $SrTiO_3$ crystal and the like.

In the practice of the invention, the sputtering atmosphere should contain nitrogen. Preferably, a mixed gas of nitrogen and oxygen and/or an inert gas such as Ar, He, Ne or the like is used at a pressure of 0.4 to 4 Pa. When a mixed gas of oxygen and nitrogen is used, the dielectric constant of the thin film increases with an increase of the oxygen content and the breakdown voltage is not lower than 2 times the breakdown voltage of the case where a mixed gas of oxygen and argon gases is used as usual, until the oxygen content reaches about 80% by volume. For electroluminescent purposes, the ratio by volume of oxygen and nitrogen of 1:1 is preferred.

On the other hand, when a mixed gas of oxygen, nitrogen and an inert gas is used, good results are obtained with regard to the breakdown electric field strength and the dielectric constant using a mixed gas composition of 0.5 to 50% by volume of nitrogen, 0.5 to 50% by volume of oxygen and 0.5 to 50% by volume of an inert gas.

In general, the dielectric thin film is formed in a thickness of 50 to 5000 nm in order to obtain good electric characteristics.

The application of the dielectric thin film as a thin film electroluminescent device is described with reference to FIG. 2. In the figure, there is shown a thin film electroluminescent device E which includes a glass substrate 21. On the substrate 21 are superposed, in the named order, an indium-tin oxide film 22 (ITO film) as a transparent electrode, a first dielectric thin film 23 consisting essentially of a perovskite type oxide, a phosphor layer 24, a second dielectric layer 25 and a back electrode 26, such as Al, in the form of a stripe. The transparent electrode 22 may be made of other materials such as $SnO_2$, ZnO and the like and is generally formed in a thickness of 100 to 1000 nm. The first dielectric thin layer 22 is made of such a perovskite type oxide as described with regard to the dielectric thin film element of the first embodiment of the invention. The thickness of the first dielectric thin layer ranges from 50 to 2000 nm.

The phosphor layer 24 formed on the first dielectric thin layer 23 is made of any known materials used for these purposes including, for example, ZnS containing Mn. The second dielectric layer is made of materials, such as, for example yttrium oxide, BaTa$_2$O$_6$, PbNb$_2$O$_6$, Al$_2$O$_3$ and the like although Ba(Sn,Ti)O$_3$ perovskite type oxides may be used. This EL device can be fabricated by a usual manner, as will be more particularly described in examples, except that the first dielectric thin layer is formed by sputtering in a sputtering atmosphere containing nitrogen. The EL device using the perovskite type oxide thin layer 23 has a greatly improved luminance and breakdown voltage because of the high breakdown electric field strength of the first layer 23 as will be particularly described hereinafter.

A thin film transistor using the dielectric thin film according to another embodiment of the invention is described with reference to FIG. 3. In the figure, there is shown a thin film transistor T which has an insulative or dielectric substrate 31 having a gate electrode 32 made, for example, of Al, Cr, Au or the like. A gate oxide layer 33 of a perovskite type oxide is formed in such a way to cover the gate electrode 32 as shown. On the gate oxide layer 33 are formed a semiconductor layer 34, a source electrode 35 and a drain electrode 36 so that the source electrode 35 and the drain electrode 36 are electrically connected through the semiconductor layer 34.

When the mutual conductance of a thin film transistor is taken as $g_m$, it can be represented as follows:

$$g_m = W/L \cdot \mu C_{ox}(V_G - V_T)$$

in which W represents a width of a channel of the transistor, L is a length of the channel, $\mu$ is a mobility of the transistor layer 34, $C_{ox}$ is a capacitance per unit area of the oxide layer 33, $V_G$ is a gate voltage of the transistor, and $V_G$ is a threshold voltage. Here, $C_{ox}$ is represented by $C_{ox} = \epsilon_0 \epsilon_1 / t_{ox}$ in which $\epsilon_0$ is a dielectric constant of vacuum, $\epsilon_1$ is a specific inductive capacity of the oxide layer 33 and $t_{ox}$ is a thickness of the layer 33. Accordingly, in order to increase $g_m$, it is necessary to use a material having a large value of $\epsilon_1$.

In known thin film transistors, when a voltage is applied between the gate and source electrodes in order to vary the drain current, an electric current is also passed between the gate and source electrodes (gate leakage), thus causing $g_m$ of the transistor to be small. When a voltage is applied between the source and drain electrodes at a gate voltage of zero, the drain current $I_{off}$ becomes large if the gate leakage occurs. Accordingly, the ratio of the drain currents $I_{on}$ produced on application of a gate voltage and $I_{off}$ produced on application of no gate voltage becomes very small when the gate leakage increases.

The thin film transistor of the invention has a very small gate leakage, so that $I_{off}$ is below 1 nA. The specific inductive capacity of the oxide layer is not less than ten times the capacity of a known Al$_2$O$_3$ layer. In addition, the $I_{on}/I_{off}$ ratio of the transistor exceeds 10$^4$ and thus, the transistor can be effectively used to drive a matrix-type EL display.

The semiconductor and substrate used in the thin film transistor of the invention may be made of any known materials oridinarily used in this field of the art. Preferable semiconductors having good affinity for the perovskite type oxides include CdSe, CdS, InSb, Te, amorphous Si and the like, of which CdSe is most preferable.

The present invention is described more particularly by way of examples.

EXAMPLE 1

Dielectric thin films were formed using the apparatus of FIG. 1. Strontium titanate was provided as a perovskite type oxide target and subjected to the high frequency magnetron sputtering while passing different types of sputtering gases from the respective ports 16 and controlling the pressure of the mixed gases at 0.5 to 3 Pa., by the use of the exhaust system 17. The temperature of the glass substrate 15 attached to the holder 14 was maintained at 400° C. The glass substrate 15 used had an indium tin oxide film (ITO film) on one surface of the substrate on which the dielectric thin film layer was formed.

As a result, it was found that when N$_2$ gas alone was used as the sputtering gas, the dielectric constant decreased by about 10% as compared with a known case where Ar and O$_2$ gases were used as the sputtering gas, but the breakdown voltage increased to two or more times. The figure of merit, $q_m$, of a thin film capacitor was not less than 1.8 times a capacitor using the known thin film. Moreover, when O$_2$ gas was mixed with N$_2$ gas, the dielectric constant of the resultant dielectric thin film increased with an increasing content of oxygen gas. The breakdown voltage was found to be two times or more the breakdown voltage of a known thin film obtained by the use of a mixed gas of O$_2$ gas and Ar gas until the content of oxygen gas reached about 80% by volume. The light transmittance of the thin film of the invention in the visible light range was found to be 90% or over.

Furthermore, when mixed gases of Ar, O$_2$ and N$_2$ gases were used, the figure of merit of the resulting thin film capacitors increased to 1.5 times or more similar to the case using mixed gases of N$_2$ and O$_2$ gases.

The above procedure was repeated using, as the perovskite type oxide target, Ba(Sn,Ti)O$_3$ ceramics, (Sr,Ba) (Ti,Zr)O$_3$ ceramics, and Sr(Ti,Hf)O$_3$ ceramics. As a result, it was found that since N$_2$ gas was contained in the sputtering gas, the figure of merit of thin film capacitors using the resultant dielectric thin films increased over the case where N$_2$ gas was not used in the sputtering gas. The test results are summarized in Table 2 below.

TABLE 2

| Target of of Perovskite | Specific Inductive Capacity ($\epsilon_r$) | $E_b$ (MV/cm) | $q_m$ (C/m$^2$) | N$_2$ gas not used $\epsilon_r$ | $E_b$ (MV/cm) | $q_m$ (C/m$^2$) |
|---|---|---|---|---|---|---|
| Sr(Zr$_{0.1}$Ti$_{0.9}$)O$_3$ | 100 | 3.5 | 0.31 | 110 | 2.5 | 0.24 |
| Sr(Zr$_{0.2}$Ti$_{0.8}$)O$_3$ | 80 | 4.5 | 0.32 | 100 | 2.5 | 0.22 |
| PbTiO$_3$ | 120 | 1.0 | 0.10 | 150 | 0.5 | 0.07 |
| SrTiO$_3$ | 110 | 3.0 | 0.30 | 140 | 1.5 | 0.19 |
| Ba(Sn$_x$Ti$_{1-x}$)O$_3$ 0.05 < x < 0.3 | 30–120 | 4–5 | 0.16–0.44 | 40–160 | 1–3 | 0.05–0.27 |
| Ba(Sn$_{0.2}$Ti$_{0.8}$)O$_3$ | 110 | 4.5 | 0.44 | 120 | 3.0 | 0.31 |
| (Sr,Ba) (Ti,Zr)O$_3$ | 40–160 | 3–5 | 0.25–0.4 | 40–180 | 0.8–2.5 | 0.08–0.25 |

TABLE 2-continued

| Target of of Perovskite | Specific Inductive Capacity ($\epsilon_r$) | $E_b$ (MV/cm) | $q_m$ (C/m$^2$) | N$_2$ gas not used | | |
|---|---|---|---|---|---|---|
| | | | | $\epsilon_r$ | $E_b$ (MV/cm) | $q_m$ (C/m$^2$) |
| SrTi$_{0.8}$Hf$_{0.2}$O$_3$ | 130 | 3 | 0.34 | 150 | 1.0 | 0.13 |

As will be apparent from the above results, the dielectric thin films obtained by sputtering perovskite type oxides in a sputtering gas containing N$_2$ gas is very effective in providing thin film capacitors whose figure of merit is high.

The amount of nitrogen in the dielectric thin film could be measured by the Auger analysis, revealing that the amount was smaller than as expected from a ratio of nitrogen gas to oxygen gas in the sputtering gas. Although the content of nitrogen in the dielectric layer was found to be proportional to the ratio of nitrogen to oxygen in the sputtering atmosphere, the quantitative determination of the content was difficult and only a qualitative tendency was confirmed. The X-ray analysis of the dielectric thin films revealed that peaks in the planes (110), (200) and (111) of the perovskite structure were observed, but significant differences between the films formed using nitrogen gas and the films formed without use of any nitrogen gas could not be found with respect to the lattice constant and the orientation.

EXAMPLE 2

Figure 2:
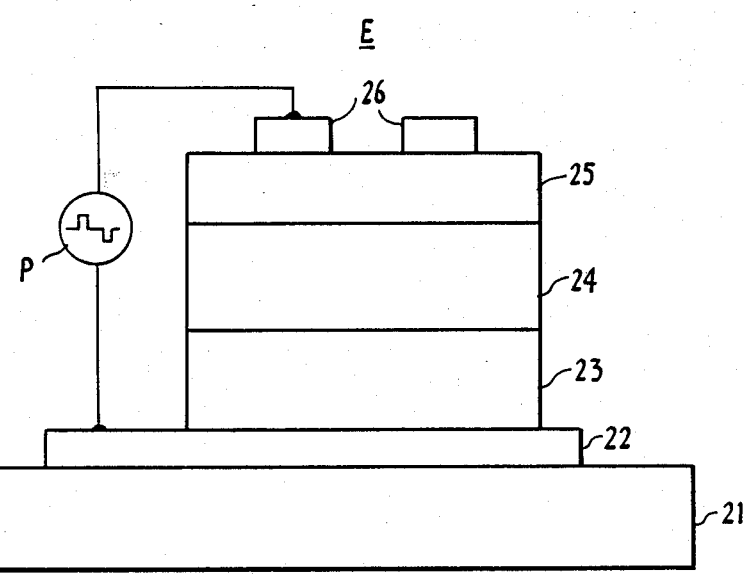
FIG. 2 is a schematic side view of a thin film electroluminescent device according to another embodiment of the invention.

A thin film electroluminescent device of the type as shown in FIG. 2 was made. An indium-tin xide (ITO) film was formed on a glass substrate in the form of a stripe and used as a transparent electrode. On the electrode was formed a first dielectric layer in different thicknesses of from 300 to 500 nm by a sputtering method in which Sr(Ti,Zr)O$_3$ ceramics were used as a target. The temperature of the substrate was set at 400° C. and a mixed gas of nitrogen and oxygen was used as a sputtering gas at a pressure of 0.8 Pa. The resulting films were transparent and had a specific inductive capacity of from 60 to 100 and a breakdown electric field strength of from 3.5 to 4.5 MV/cm. Thereafte, a phosphor layer of ZnS containing Mn was formed on the dielectric thin film in a thikcness of 500 nm by an electron beam vacuum deposition, followed by thermal treatment in vacuum at 450° C. Further, a second dielectric thin layer was formed on the phosphor layer by subjecting yttrium oxide to electron beam vacuum deposition in a thickness of from 200 to 300 nm. The evaporation source used was a Y$_2$O$_3$ ceramic. Alternatively, BaTa$_2$O$_6$ was sputtered to form the second dielectric thin layer. Finally, a back electrode was formed on the second dielectric thin layer by evaporation of aluminum by resistance heating. The thickness of the back electrode was from 100 to 200 nm. Thus, EL devices could be obtained. The EL devices were driven by application of AC pulses from a pulse generator P in FIG. 2 at a repetitive frequency of 5 KHz to detemine a voltage-luminance characteristic. The luminous characteristic became maximal when the ratio of nitrogen and oxygen at the sputtering was 1:1 and the voltage at which light started to emit was below 100V.

As compared with a dielectric film formed by the use of argon and oxyen as the sputtering gas, the luminance of the devices of the invention was 1.5 to 2.5 times higher and was 10$^4$ Cd/m$^2$ or higher. The starting voltages for light emission were approximately equal to each other. However, the breakdown voltage increased to 1.5 to 2 times the voltage of the known device.

The above procedure was repeated except that Ba(Sn,Ti)O$_3$, (Ba,Sr)TiO$_3$ and Sr(Ti,Hf)O$_3$ were used as the perovskite type oxide, thereby forming the first dielectric thin layer and that Ba(Sn,Ti)O$_3$ was used to form the second dielectric thin layer. The luminance and breakdown voltage were improved to extents of 1.5 to 3 times those attained by the EL device using the first dielectric thin layer formed by sputtering in a mixed gas of argon and oxygen. Good results were obtained when Ba(Sn,Ti)O$_3$ was used as the second layer.

Moreover, similar results were obtained using a mixed gas of nitrogen, oxygen and argon, and it was confirmed that the sputtering speed became higher than in the case where nitrogen alone or a mixed gas of nitrogen and oxygen was used. Since the breakdown electric field strength is improved to a substantial extent, the thickness of the dielectric layer can be reduced to a half for the same breakdown voltage. In other words, the layer thickness can be reduced without lowering the reliability of the EL device. This means that an external voltage can be efficiently applied to the phosphor layer, resulting in a lowering of the drive voltage. In addition, the time necessary for the formation of the dielectric thin layer can be shortened in correspondence to the reduction in the thickness and is thus economical. The luminance of the thin film EL device using the dielectric thin layer of the invention was found to lower by below 5% after 10,000 hours.

EXAMPLE 3

Figure 3:
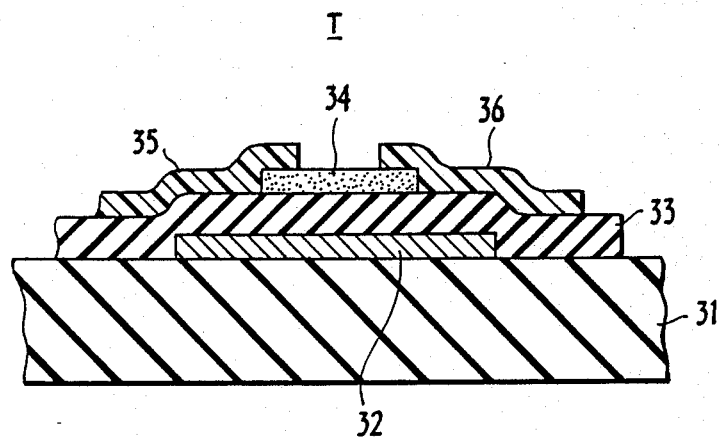
FIG. 3 is a schematic sectional view of a thin film transistor according to a further embodiment of the invention.

A thin film transistor as shown in FIG. 3 was made as follows.

An insulative substrate was provided, on which a 200 nm thick Al gate electrode was formed. Thereafter, Sr(Zr$_{0.2}$Ti$_{0.8}$)O$_3$, which is a perovskite type oxide, was used as a ceramic target and subjected to high frequency magnetron sputtering in an atmosphere of a mixed gas of nitogen and oxygen at a temperature of the substrate of 400° C. in a thickness of 250 nm, thereby forming a gate oxide layer to cover the gate electrode. On the gate oxide layer was formed a 50 nm thick semiconductor layer of CdSe, followed by forming a 100 nm thick source electrode and a 100 nm thick drain electrode as shown in FIG. 3. The source and drain electrodes were both made of aluminum, thereby obtaining a thin film transistor.

As described before, the gate oxide layer was made of the perovskite type oxide and had a specific inductive capacity, $\epsilon_1$, of 60 to 100, which is not less than about ten times the capacity of an Al$_2$O$_3$ layer ordinarily used in this art. The $I_{on}/I_{off}$ ratio was over 10$^4$, so that the transistor could be beneficially used to drive a matrix type EL display. Further, the mutual inductance of the transistor was not less than 3 times the mutual inductance of a transistor using a gate oxide layer of Al$_2$O$_3$ at the same drain current. Accordingly, the $I_{on}/I_{off}$ ratio became as high as about 10$^3$ when the gate voltage was about 5V. This means that the transistor can be suitably applied as an impedance converter of low noises which is built in a pyroelectric infrared sensor.

The interface characteristic between CdSe and the perovskite type oxide layer was found to be very good and thus, the thin film transistor was stable and underwent only a little change in quality with time.

The above procedure was repeated using Ba(Sn,Ti)O$_3$ oxides, thereby obtaining thin film transistors. The gate oxide film had the advantage that even when the film was short-circuited initially due to defects involved therein, it was electrically released at a certain electric field and thus the initial short-circuiting between the gate electrode and the drain or source electrode caused by the defects can be eliminated. In addition, the Ba(Sn,Ti)O$_3$ film had good affinity for the CdSe layer.

Similar results were obtained when using Sr(Ti,Hf)O$_3$ and (Ba,Sr)TiO$_3$ perovskite oxides.

What is claimed is:

1. In a dielectric thin film element which comprises a dielectric substrate and a dielectric thin film of a perovskite type oxide formed on said substrate, the improvement wherein said dielectric thin film is formed by sputtering a composite perovskite oxide of the formula AMO$_3$, wherein A represents at least two members selected from the group consisting of Ca, Sr, Ba and Pb and M represents at least two members selected from the group consisting of Ti, Zr, Hf and Sn in an atmosphere comprising a mixture of nitrogen and oxygen or a mixture of nitrogen, oxygen and argon, to form a dielectric thin layer on said dielectric substrate, said dielectric thin film comprising nitrogen and therefore having an improved breakdown electric field strength.

2. The dielectric thin film element according to claim 1, wherein said atmosphere is a mixture of nitrogen and oxygen gases.

3. The dielectric thin film element according to claim 2, wherein said mixture contains up to 80% by volume of oxygen.

4. The dielectric thin film element according to claim 1, wherein said atmosphere is a mixture of nitrogen, oxygen and an inert gas.

5. A method for making a dielectric thin film element which comprises providing a dielectric substrate, and subjecting a composite perovskite oxide ceramic of the formula AMO$_3$, wherein A represents at least two members selected from the group consisting of Ca, Sr, Ba and Pb and M represents at least two members selected from the group consisting of Ti, Zr, Hf and Sn, to sputtering in an atmosphere comprising a mixture of nitrogen and oxygen or a mixture of nitrogen, oxygen and argon to form a dielectric thin layer on said dielectric substrate, said dielectric thin film comprising nitrogen and therefore having an improved breakdown electric field strength.

6. A method according to claim 5, wherein said atmosphere is a mixture of nitrogen and oxygen and the sputtering is effected at a pressure of the mixed gas of 0.4 to 4 Pa.

7. A method according to claim 6, wherein said mixture contains up to 80% by volume of oxygen.

8. A method according to claim 6, wherein a ratio by volume of nitrogen and oxygen is 1:1.

9. A method according to claim 5, wherein said atmosphere is a mixture of nitrogen, oxygen and an inert gas.

10. A method according to claim 9, wherein said mixture consists essentially of from 0.5 to 50% by volume of nitrogen, from 0.5 to 50% by volume of oxygen and from 0.5 to 50% by volume of an inert gas.

11. A method according to claim 5, wherein the sputtering is effected at a temperature of the substrate of from 300° to 600° C.

* * * * *

UNITED STATES PATENT AND TRADEMARK OFFICE
CERTIFICATE OF CORRECTION

PATENT NO. : 4,888,246
DATED : December 19, 1989
INVENTOR(S) : Jun Kuwata et al

It is certified that error appears in the above-identified patent and that said Letters Patent is hereby corrected as shown below:

On the title page , under "Foreign Application Priority Data":

change "May 23, 1986" (both occurrences) to --May 23, 1985--.

Signed and Sealed this

Twenty-sixth Day of February, 1991

Attest:

HARRY F. MANBECK, JR.

*Attesting Officer*  *Commissioner of Patents and Trademarks*